United States Patent [19]
Kuse et al.

[11] Patent Number: 5,315,152
[45] Date of Patent: May 24, 1994

[54] LEAD FRAME WITH IMPROVED ADHESIVENESS PROPERTY AGAINST PLASTIC AND PLASTIC SEALING TYPE SEMICONDUCTOR PACKAGING USING SAID LEAD FRAME

[75] Inventors: Takashi Kuse; Nobuaki Nakashima, both of Kanagawa, Japan

[73] Assignee: Kabushiki Kaisha Toshiba, Kanagawa, Japan

[21] Appl. No.: 778,914

[22] PCT Filed: May 30, 1991

[86] PCT No.: PCT/JP91/00728
§ 371 Date: Dec. 30, 1991
§ 102(e) Date: Dec. 30, 1991

[87] PCT Pub. No.: WO91/19320
PCT Pub. Date: Dec. 12, 1991

[30] Foreign Application Priority Data
May 31, 1990 [JP] Japan ................. 2-142964

[51] Int. Cl.⁵ ............... H01L 23/48; H01L 29/44; H01L 29/60
[52] U.S. Cl. .................... 257/677; 257/666
[58] Field of Search .............. 257/677, 762, 767; 148/411, 412, 413, 414

[56] References Cited
U.S. PATENT DOCUMENTS
4,640,723  2/1987  Sugai et al. .............. 148/411
5,004,581  4/1991  Takagi et al. ............. 148/412
5,028,282  7/1991  Kubozono et al. .......... 148/414
5,149,499  9/1992  Kim et al. ................ 148/411

FOREIGN PATENT DOCUMENTS
0100817   2/1984  European Pat. Off. .
59-193233 11/1984  Japan .

Primary Examiner—Rolf Hille
Assistant Examiner—S. V. Clark
Attorney, Agent, or Firm—Finnegan, Henderson, Farabow, Garrett & Dunner

[57] ABSTRACT

A lead frame including a matrix for the lead frame formed of a copper based alloy and an oxide layer formed on the lead frame. A copper based alloy including dispersive particles of which part distributively appears on the surface is used as a matrix for the lead frame. Alternatively, a copper based alloy containing P at a content not more than 30 ppm may be used. In a case where the matrix for the lead frame is formed of a copper based alloy containing dispersive particles, since an oxide layer containing an oxide derived from the dispersive particles is formed on the matrix, a property of adhesiveness of the oxide layer is improved. Also in a case where the matrix for the lead frame is formed of a copper based alloy containing P at a specified content, an oxide layer having excellent adhesiveness can be formed. The oxide layer improves a property of adhesiveness of the sealing plastic as well as reliability on a semiconductor package.

16 Claims, 3 Drawing Sheets

LEAD FRAME WITH IMPROVED ADHESIVENESS PROPERTY AGAINST PLASTIC AND PLASTIC SEALING TYPE SEMICONDUCTOR PACKAGING USING SAID LEAD FRAME

TECHNICAL FIELD

The present invention relates to a lead frame preferably employable for a plastic sealing type integrated circuit package or the like. Further, the present invention relates to a semiconductor package using the foregoing lead frame.

BACKGROUND ART

In recent years, as a large number of semiconductor elements are highly integrated with each other and produced on a mass production line, research works have been positively conducted for developing a material employable for the semiconductor elements. In addition, it has been requested in many application fields that development works are conducted further with respect to each member for the semiconductor element in consideration of properties required for the material employable for the foregoing member and a cost level of the material.

For example, a Fe-Ni based alloy such as 42 wt % Ni-Fe, 29 wt % Ni-17 wt % Co-Fe or the like each having a thermal expansion coefficient approximate to that of the semiconductor elements has been hitherto used as a material for a lead frame used for a semiconductor package such an integrated circuit package or the like. Since expensive nickel and cobalt are used as alloy components for the iron based lead frame, there appear problems that lead frames are produced at a high cost, and an excellent property of heat radiation, i.e., excellent thermal conductivity, which is required as a number of semiconductor elements are highly integrated with each other, is not satisfactory. In view of the foregoing problems, a comparatively inexpensive copper alloy having an excellent property of heat radiation is being used as a material employable for lead frames at present. For example, a Cu-Sn based copper alloy, a Cu-Sn-Ni-Si based copper alloy, a Cu-Fe-P based copper alloy and a Cu-Sn-Ni-Si-Zn based copper alloy are used as a copper alloy employable for lead frames.

However, in a case where a plastic sealing type semiconductor package is constructed using a lead frame made of one of the aforementioned copper alloys, there arises a difficulty that a sufficiently excellent property of adhesiveness of the lead frame to a sealing plastic is hardly obtained. If the lead frame has poor adhesiveness to the sealing plastic, moisture resistance, weather resistance, erosion resistance or the like of an integrated circuit, a large scale integrated circuit or the like are affected adversely. Therefore, incorrect adhesion of the lead frame to the sealing plastic reduces reliability on an integrated circuit package, a large scale integrated circuit or the like.

For this reason, it has been strongly requested that a lead frame exhibiting an excellent property of adhesiveness to the sealing plastic is developed. In addition, it has been likewise intensely requested that a excellent reliable semiconductor package using the foregoing lead frame is developed.

The present invention has been made in consideration of the aforementioned background.

An object of the present invention is to provide a lead frame having an excellent property of adhesiveness to a sealing plastic.

Another object of the present invention is to provide a semiconductor package having an excellent reliability by using the foregoing lead frame having an excellent property of adhesiveness to a sealing plastic.

DISCLOSURE OF THE INVENTION

According to a first aspect of the present invention, there is provided a lead frame which is characterized in that the lead frame comprises a matrix for the lead frame consisting essentially of a copper based alloy containing dispersive particles, a part of the dispersive particles being distributed and exposed on the surface of the matrix, and an oxide layer formed at least on a part of the matrix for the lead frame, the part contacting with a sealing plastic, the oxide layer containing an oxide of the dispersive particles distributed on the surface of the matrix for the lead frame.

In addition, according to a second aspect of the present invention, there is provided a lead frame which is characterized in that the lead frame comprises a matrix for the lead frame composed of a copper based alloy containing P at a content of not more than 30 ppm, and an oxide layer formed at least on a part of the matrix for the lead frame, the part contacting with a sealing plastic.

Further, according to a third aspect of the present invention, there is provided a semiconductor package comprising a semiconductor tip, a lead frame having the semiconductor tip mounted thereon, the lead frame being electrically connected to the semiconductor tip, and a sealing plastic for gastightly sealing the semiconductor tip and a part of the lead frame, wherein the lead frame satisfies structural conditions associated with the lead frame in accordance with the first aspect of the present invention (hereinafter referred to as a first lead frame) and/or the lead frame in accordance with the second aspect of the present invention (hereinafter referred to as a second lead frame).

According to the present invention, the matrix for the lead frame is formed of a copper based alloy. With respect to a composition of the copper based alloy, it is exemplified that the copper based alloy contains at least one selected from a group of Cr, Zr and Ti at a content of 0.005% by weight to 2% by weight and the balance is consist essentially of Cu. Employment of the foregoing copper based alloy makes it possible to improve the strength of the lead frame without reduction of electrical conductivity of the lead frame. If the copper based alloy contains additives by an excessively large quantity, electrical conductivity and workability of the lead frame are degraded undesirably. On the contrary, if the copper based alloy contains additives by an excessively small quantity, a strength and heat resistance of the lead frame are reduced unsatisfactorily. For these reasons, it is preferable that the copper based alloy contains additives within the aforementioned range.

In addition, it is acceptable that the copper based alloy contains at least one selected from a first group of Ni, Sn, Fe, Co, Zn, Be, B, Mg, Ag, Si, Mn, Ca, Al, a rare earth element, Ca and Ge at a content of 0.005% by weight to 1% by weight and/or at least one selected from a second group of Nb, V, Hf, Mo, W, Y, Ta, La and Ga at a content of 0.005% by weight to 1% by weight. Each of the elements belonging to the first group is an element effective for improving the strength of the lead frame. In addition to the foregoing effect, the elements of B and Ge have an effect of preventing crystalline grains from being coarsely enlarged, respectively, the elements of Mg, Mn, Al and a rare earth element have an effect of improving a deoxidative power, respectively the element of Si has the effects of improving a power of deoxidative power and preventing crystalline grains from being coarsely enlarged, and the element of Ca has the effects of improving the ability of cutting operation. Like the elements belonging to the first group, each of the elements belonging to the second group is an element effective for improving the strength of the lead frame. In addition to the foregoing effect, the elements of Nb, V, Hf, Mo, W, Ta and Ga have the effect of preventing the crystalline grains from being coarsely enlarged, respectively, and the element of La has an effect of improving a deoxidative power.

Additionally, it is preferable that the aforementioned copper based alloy contains crystals of which grain size is represented by a grain number more than seven in conformity with the provisions of JIS G 0551. Since the copper based alloy having a larger grain size in the above-described manner has not only an excellent electrical conductivity but also a high strength, it is preferably employable as a matrix for the lead frame. It should be noted that adjustment of the grain size is accomplished by properly determining conditions for annealing and working.

Further, according to the present invention, the matrix for the lead frame satisfies one or both of the following conditions.

(a) a copper based alloy containing dispersive particles of which part distributively appears on the surface of the matrix.

(b) a copper based alloy containing P at a content of not more than 30 ppm.

In a case of the condition (a), any material having excellent adhesiveness to an oxide layer is employable as dispersive particles. Specifically, a precipitated matter, a crystallized matter or the like derived from additives in the copper based alloy, e.g., elements of Cr, Zr, Ti or the like and their intermetallic compounds are exemplified as dispersive particles. For example, an alloy known as a distributively strengthened type (precipitation hardening type) alloy is employable as a copper based alloy containing the aforementioned dispersive particles.

It is preferable that the dispersive particles have a size of 0.1 $\mu$m to 50 $\mu$m. The dispersive particles having such a size as mentioned above are distributed such that a part of the dispersive particles appears on the surface of the matrix for the lead frame. It is preferable that the number of the dispersive particles distributed on the surface remains within the range of 100 to 100000 pieces/mm$^2$. It is more preferable that the number of the dispersive particles remains within the range of 500 to 15000 pieces/mm$^2$. It is much more preferable that the number of the dispersive particles remains within the range of 1000 to 10000 pieces/mm$^2$. If the number of the dispersive particles present on the surface is less than 100 pieces/mm$^2$, a sufficiently excellent property of adhesiveness of the matrix for the lead frame to an oxide layer is not obtained. On the contrary, if the number of the dispersive particles exceeds 100000 pieces/mm$^2$, there is a tendency that a bending property is degraded. A size of each of the dispersive particles referred to in the specification of the present invention designates a diameter of the smallest circle including each dispersive particle.

It should be noted that the copper based alloy of the condition (a) should not be limited only to the copper based alloy having the aforementioned composition but any copper based alloy may be employed, provided that dispersive particles in the form of a precipitated matter, a crystallized matter or the like can form a surface oxide layer having excellent adhesiveness. Since the copper based alloy added with such as Cr, Zr, Ti and having the precipitated foregoing elements and their intermetallic compounds has not only excellent electrical conductivity but also a high strength, the above copper based alloy is preferably employable as a matrix for the lead frame.

In a case of the condition (b), the reason why a content of P in the copper based alloy is determined to be not more than 30 ppm consists in the following facts. Specifically, if the content of P exceeds 30 ppm, a property of adhesiveness of the matrix for the lead frame to an oxide layer formed on the surface of the matrix is largely degraded, resulting in a property of adhesiveness of the matrix to a sealing plastic being degraded undesirably. It is more preferable that the content of P is not more than 10 ppm. It is much more preferable that the content of phosphor is not more than 5 ppm.

It is most preferable that the lead frame of the present invention satisfies both conditions (a) and (b).

According to the present invention, the lead frame is constructed such that an oxide layer is formed on a matrix for the lead frame. An oxide layer based on the condition (a) contains an oxide of dispersive particles distributed on the surface of the matrix. Specifically, as shown in FIG. 1, a copper based alloy 1 serving as a matrix is constructed such that dispersive particles 2 are present in a substructure 1$a$ and a part of the dispersive particles 2 distributively appears on the surface. In addition, an oxide layer 3 is constructed such that it contains an oxide 3$a$ of the dispersive particles 2$a$, which presents on the surface of the copper based alloy 1, and the oxide 3$a$ of the dispersive particles 2$a$ is distributed in an oxide 3$b$ of the substructure 1$a$ of the copper based alloy. The oxide layer 3 is forcibly formed by oxidizing the lead frame processed into a required contour or the surface of a copper based alloy plate prior to processing into a required contour. An oxide layer based on the condition (b) is likewise forcibly formed by oxidation with the except that it does not contain an oxide dispersive particles.

It is preferable that a thickness of the surface oxide layer remains within the range of 1 nm to 80 nm. It is more preferable that it remains within the range of 3 nm to 50 nm. It is much more preferable that it remains within the range of 10 nm to 30 nm. If the thickness of the oxide layer is less than 1 nm, sufficiently high uniformity of the oxide layer itself is hardly obtained. On the contrary, if it exceeds 80 nm, a property of adhesiveness of the oxide layer is degraded, and moreover, the foregoing excess leads to a factor of degrading properties of the lead frame itself. The oxide layer is formed at least in the region where a sealing plastic comes in contact with the lead frame.

With respect to a lead frame using a conventional copper based alloy, a thin oxide layer is formed on the surface of the lead frame when the lead frame is sealed with a sealing plastic. However, the copper based oxide layer exhibits excellent adhesiveness to a copper based alloy, but it is inferior with respect to adhesiveness to the sealing plastic. In addition, since the oxide layer is inevitably formed when the lead frame is sealed with the sealing plastic, it is inferior with respect to uniformity of (a thickness or the like of) the surface oxide layer itself. The inventors found out that the aforementioned inferiority of the oxide layer caused a property of adhesiveness of the lead frame to the sealing plastic to be degraded and that if a content of P in the copper based alloy exceeded 30 ppm, a property of adhesiveness of the copper based alloy to a copper based oxide layer formed on the surface of the copper based alloy was degraded remarkably.

The present invention has been made based on the aforementioned found facts. With respect to the first lead frame, an oxide layer having excellent uniformity is positively formed on the surface of a matrix for the lead frame formed of a copper based alloy, and an oxide dispersive particles is distributed in the oxide layer. Specifically, the dispersive particles formed of, e.g., an element of Cr, Zr, Ti or the like and their intermetallic compound with a copper exhibit excellent adhesiveness to a substructure of the copper based alloy, and moreover, the oxide layer exhibits excellent adhesiveness to the dispersive particles. Consequently, an oxide of the dispersive particles serves as a kind of anchor for the oxide layer formed on the whole surface of the copper based alloy, whereby a property of adhesiveness of the oxide layer to the matrix for the lead frame is improved remarkably. In other words, a surface oxide layer tightly secured to the surface of the copper based alloy is obtained.

With respect to the second lead frame, since an oxide layer having excellent uniformity is positively formed on the surface of a matrix for a lead frame formed of a copper based alloy containing P at a content not more than 30 ppm, the oxide layer having sufficiently high adhesiveness to the copper based alloy is obtainable.

With respect to either one of the first and second lead frames, since the oxide layer itself exhibits excellent adhesiveness to a sealing plastic, the result is that a property of adhesiveness of the matrix for the lead frame to the sealing plastic can be improved remarkably.

According to the present invention, the lead frame is produced by way of the following steps.

In a case of a copper based alloy of the condition (a), alloy components satisfying the above mentioned composition of the copper based alloy are first molten and the molten alloy is then cast and solidified at a cooling rate of, e.g., 5° C./sec. Such rapid cooling is intended to suppress generation of a precipitated particles or the like which usually appears during a casting operation. Thus, a size of dispersive materials such as a precipitated particle, a crystallized particle, or the like can easily be controlled at subsequent steps.

Next, after completion of a hot working operation, the cast alloy is subjected to solution treatment by rapid cooling from temperatures of 600° C. or higher. This solution treatment allows a solid solution kept in supersaturated state to be formed. However, if a temperature for the solution treatment is lower than 600° C., a sufficiently effect by the solution treatment is not obtained, and controllability on a size of the dispersive particles such as a precipitated particle, a crystallized particle or the like is degraded.

Subsequently, the copper based alloy is subjected to cold working such as cold rolling or the like, to processed into a required contour for a lead frame. Thereafter, it is subjected to aging. This aging treatment allows a single element, e.g., Cr, Zr, Ti or the like and their intermetallic compound with a copper to be gradually precipitated in the substructure of the copper based alloy. Conditions for the aging treatment are properly determined in consideration of conditions for the step of rapid cooling and the step of solution treatment after completion of the casting operation in such a manner that a size of dispersive particles and the number of dispersive particles present on the surface of the copper based alloy remain within the aforementioned range. For example, the aging treatment is conducted at a temperature of 300° C. to 500° C. for a time of about 0.02 hour to 6 hours.

In addition, in a case of the copper based alloy of the condition (b), alloy components satisfying a composition of the copper based alloy containing P at a content not more than 30 ppm are used. After hot working and cold working, it is processed into a required contour for a lead frame.

Subsequently, the copper based alloy which has been worked in the above-described manner is subjected to surface oxidizing treatment thereby to forcibly form an uniform oxide layer. Conditions for the surface oxidizing treatment are properly determined such that a thickness of the oxide layer remains within the aforementioned range. For example, it is preferable that the treatment is conducted at a temperature of 150° C. to 250° C. for a time of about one minute to ten minutes in the atmosphere. Alternatively, the step of surface oxidizing treatment is conducted before the copper based alloy is worked to assume a required final contour for the lead frame.

BEST MODE FOR CARRYING OUT THE INVENTION

Now, the present invention will be described in detail hereinafter with reference to the preferred embodiments.

First, embodiments of the lead frame in accordance with the present invention will be described below.

EXAMPLES 1 TO 12

Copper based alloys of which composition is shown in Table 1 were first molten and the molten alloy were then continuously cast at a cooling speed of 5° C./sec from its melting temperature. Subsequently, each ingot produced by the continuous casting operation was subjected to hot rolling at a temperature of about 850° C. Thereafter, the hot rolled plate was quickly cooled from a temperature higher than 600° C. so as to conduct solution treatment. Next, the hot rolled plate was subjected to cold rolling to produce a sheet having a thickness of 0.25 mm, and the resultant sheet was subjected to aging at a temperature of 450° C. for two hours. After completion of the aging treatment, a size of each dispersive particle in the copper based alloy and the number of dispersive particles appearing on the surface were measured by a microscope. Results derived from the microscopical observation are shown in Table 1.

Figure 1:
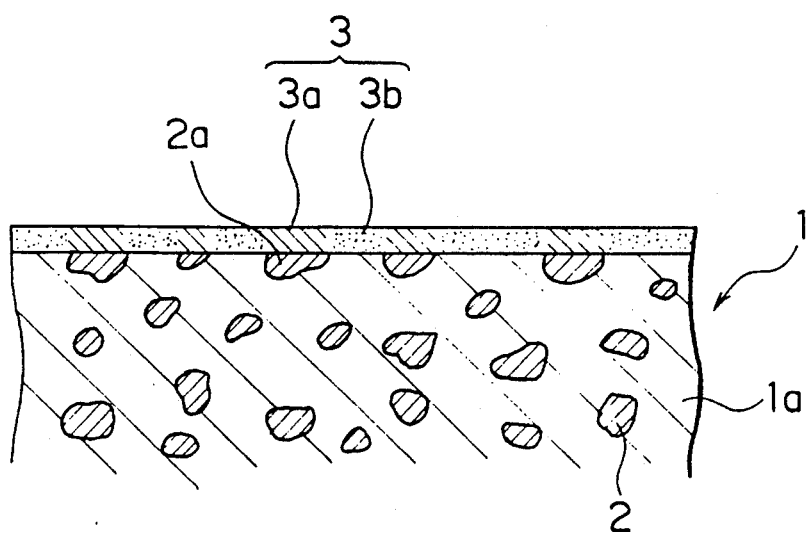
FIG. 1 is an enlarged sectional view which schematically illustrates the structure of a lead frame in accordance with the present invention.
Figure 2:
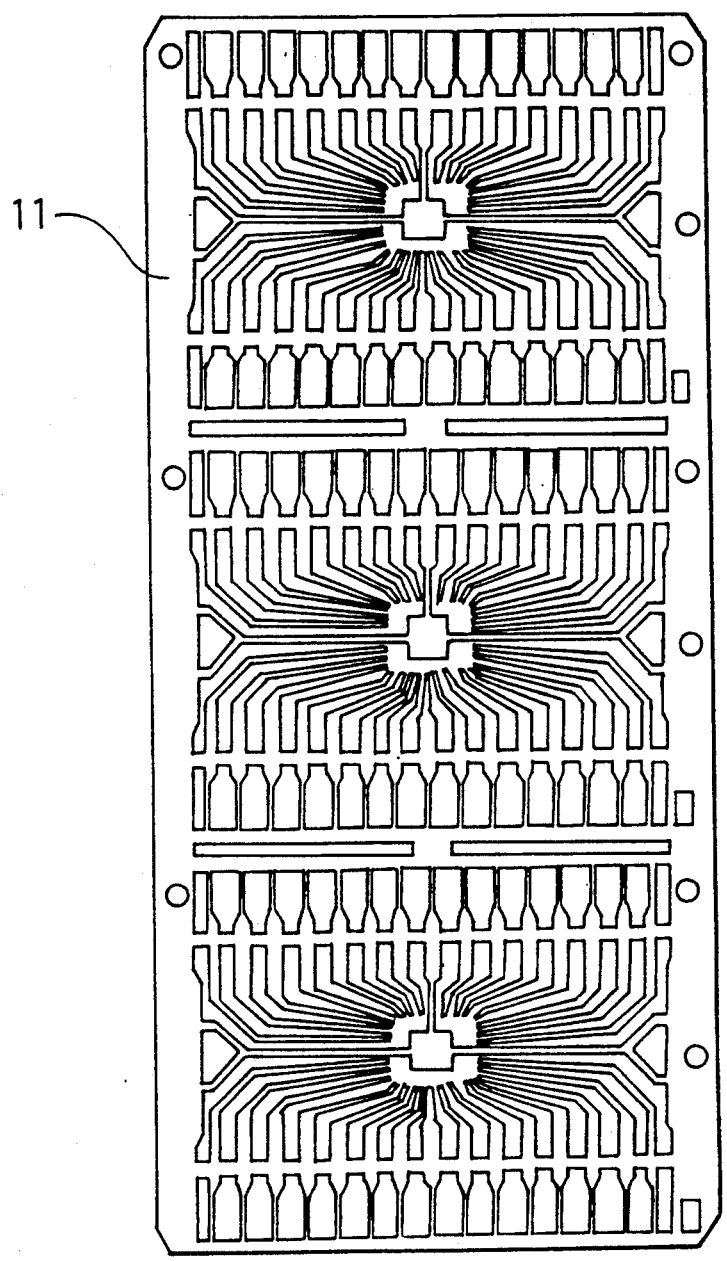
FIG. 2 is a plan view of the lead frame in accordance with one embodiment of the present invention.

Next, the surface of the sheet-shaped copper based alloy which had been subjected to aging was oxidized in an atmosphere at a temperature of 200° C. for five minutes so that an oxide layer was formed on the surface of the sheet-shaped copper based alloy. Results derived from measuring operations performed for a thickness of the oxide layer are additionally shown in Table 1. Thereafter, the sheet-shaped copper based alloy was punched to produce a required lead frame 11 of which contour is shown in FIG. 2.

It should be added that when an oxide layer having a thickness of more than 80 nm was formed, peeling took place, resulting in the lead frame having the foregoing oxide layer formed thereon failing to be put in practical use.

EXAMPLES 13 AND 14

Copper based alloys of which composition is shown in Table 1 were first molten and the molten alloy were then continuously cast at a cooling rate of 5° C./sec from its melting temperature. Subsequently, each ingot was subjected to hot rolling at a temperature of about 850° C. Thereafter, the hot rolled plate was subjected to cold rolling to produce a sheet having a thickness of 0.25 mm.

Next, the surface of the sheet-shaped copper based alloy was oxidized in an atmosphere at a temperature of 200° C. for five minutes to form an oxide layer having a thickness of 5 nm to 80 nm. Thereafter, the sheet-shaped copper based alloy was punched by actuating the press machine to produce a required lead frame 11 of which contour is shown in FIG. 2.

COMPARATIVE EXAMPLES 1 AND 2

Lead frames 11 were produced under the same conditions as those in Example 13 by using copper based alloys of which composition is shown in Table 1.

COMPARATIVE EXAMPLES 3 AND 4

Copper based alloys of which composition is shown in Table 1 were successively subjected to casting, hot rolling, solution treatment, cold rolling and aging under the same conditions as those in Example 1 so that sheets each having a thickness of 0.25 mm were produced. The number of dispersive particles appearing on each sheet after completion of the aging treatment is additionally shown in Table 1. Each sheet-shaped copper based alloy was punched to produce a lead frame 11 of which contour is shown in FIG. 2. In this case, the surface of the sheet-shaped copper based alloy was not oxidized.

COMPARATIVE EXAMPLES 5 AND 6

Copper based alloys of which composition is shown in Table 1 were successively subjected to casting, hot rolling and cold rolling under the same conditions as those in Example 13 to produce sheets each having a thickness of 0.25 mm. Each sheet-shaped copper based alloy was punched to produce a lead frame 11 of which contour is shown in FIG. 2. Also in this case, the surface of the sheet-shaped copper based alloy was not oxidized.

An adhesive strength of oxide layers on the surface of each lead frame produced in accordance with the respective examples and the respective comparative examples was measured in such a manner as mentioned below. In addition, an adhesiveness strength of a sealing plastic to the oxide layer was measured with respect to the respective examples and the respective comparative examples in the same manner as mentioned above. Results derived from the measurements are shown in Table 2.

(1) A property of adhesiveness of the oxide layer: A piece of adhesive tape having dimensions of 30 mm×30 mm was adhesively placed on each oxide layer formed in the above-described manner and the adhesive tape was then peeled. A property of adhesiveness of the oxide layer was evaluated based on an area of the oxide layer which was peeled when peeling the adhesive tape.

(2) A strength of adhesiveness of the sealing plastic : A layer of epoxy plastic was formed on each oxide layer formed in the above-described manner and the epoxy plastic layer was peeled from the oxide layer. A peeling strength of the epoxy plastic layer was measured.

As is apparent from the results shown in Table 2, each lead frame which contains P at a concentration not more than 30 ppm and has an oxide layer formed on the surface thereof which contains an oxide of dispersive particles is superior with respect to a property of adhesiveness of an oxide layer on the surface thereof to a ferrous substrate. This means that the lead frame exhibits an excellent adhesive strength to a sealing plastic. In addition, each lead frame produced from a copper based alloy containing P at a concentration not more than 30 ppm or each lead frame having an oxide layer formed on the surface thereof which contains an oxide of dispersive particles exhibits a problemlessly excellent adhesive strength to the sealing plastic. On the contrary, it is apparent that each lead frame having no oxide layer forcibly formed thereon or each lead frame containing P at a concentration in excess of 30 ppm and having an oxide layer simply formed thereon has poor adhesiveness to the sealing plastic.

According to the present invention, it is apparent from the aforementioned results that a lead frame exhibiting a practically sufficient adhesive strength relative to the sealing plastic can be obtained. In addition, when a semiconductor package is constructed by using the foregoing lead frame, reliability of the semiconductor package on moisture resistance, weather resistance, erosion resistance or the like can be improved remarkably.

Next, a semiconductor package in accordance with another embodiment of the present invention will be described below.

Figure 3:
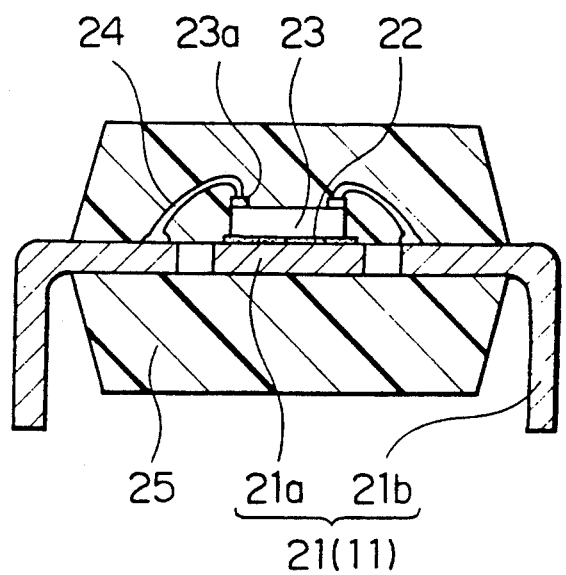
FIG. 3 is a sectional view which illustrates the structure of a semiconductor package in accordance with another embodiment of the present invention.

FIG. 3 is a sectional view which schematically illustrates the structure of a semiconductor package in accordance with the embodiment of the present invention. In the drawing, reference numeral 21 designates a lead frame of which contour is shown in FIG. 2 and which is designated by reference numeral 11 in FIG. 2. An oxide layer is formed on the surface of the lead frame 21. The lead frame 21 includes a tip mounting portion 21a on which a semiconductor tip 23 is connectedly mounted with a solder layer 22 interposed therebetween. The semiconductor tip 23 is electrically connected to the lead frame 21 via Au lead wires 24 connected to an Au electrode 23a. The semiconductor tip 23 is molded integral with the Au lead wires 24 and a part of the lead frame 21 using a sealing plastic 25. The outer peripheral part of the lead frame 21 is protruded outward of the sealing plastic 25 to serve as a lead.

When the lead frame described in the each example was used as the lead frame 21 of the semiconductor package having the above structure, no crack took place between the lead frame 21 and the sealing plastic 25, and moreover, excellent reliability of the semiconductor package could be maintained for a long time of practical use. For the purpose of comparison, when lead frames produced in conformity of the aforementioned comparative examples were used, crack took place during a molding by the sealing plastic 25. Although no crack took place, incorrect operation was recognized after practical use for a long time.

As is apparent from the above description, the present invention can stably provide a semiconductor package having excellent reliability.

INDUSTRIAL APPLICABILITY

As described above, according to the present invention, a lead frame has an excellent property of adhesiveness of a matrix for the lead frame to an oxide layer on the surface of the lead frame, whereby an adhesive strength to a sealing plastic can be improved. Therefore, the lead frame of the present invention largely contributes to practical realization of a semiconductor package having high reliability on moisture resistance, weather resistance, erosion resistance or the like.

TABLE 1

| | COMPOSITION OF COPPER BASED ALLOY (% BY WEIGHT, ppm FOR P ONLY) | | | | | | | | | | | | THE NUMBER*1 OF SCATTERED PARTICLES PRESENT ON THE SURFACE OF THE COPPER BASED ALLOY | THICKNESS OF AN OXIDE LAYER (nm) |
|---|---|---|---|---|---|---|---|---|---|---|---|---|---|---|
| | Cr | Zr | Ti | Sn | Ni | Fe | Si | Zn | Co | Be | Mg | P | Cu | | |
| EXAMPLES | | | | | | | | | | | | | | | |
| 1 | 0.03 | 0.11 | 0.30 | — | — | — | — | — | — | — | — | 0 | BALANCE | 450 | 30 |
| 2 | 0.33 | 0.14 | 0.28 | — | — | — | — | — | — | — | — | 3 | BALANCE | 5400 | 26 |
| 3 | 0.31 | 0.13 | — | — | — | — | — | — | — | — | — | 2 | BALANCE | 2000 | 28 |
| 4 | 0.35 | 0.10 | 0.27 | — | — | — | — | — | — | — | — | 2 | BALANCE | 6000 | 28 |
| 5 | — | — | — | 1.24 | 3.1 | — | 0.6 | 1.1 | — | — | — | 5 | BALANCE | 1000 | 27 |
| 6 | — | — | — | — | 3.0 | — | 0.5 | 0.4 | — | — | — | 3 | BALANCE | 700 | 26 |
| 7 | 0.30 | 0.13 | 0.26 | — | — | — | — | — | — | — | — | 35 | BALANCE | 4500 | 24 |
| 8 | 0.27 | 0.07 | — | — | — | — | — | — | — | — | — | 52 | BALANCE | 3700 | 25 |
| 9 | 0.22 | 0.04 | 0.3 | — | 0.7 | — | 0.03 | — | — | — | 0.05 | 6 | BALANCE | 12000 | 25 |
| 10 | 0.23 | 0.11 | — | — | — | — | — | — | — | 0.15 | — | 5 | BALANCE | 2100 | 30 |
| 11 | 0.26 | 0.13 | — | — | — | — | — | — | 0.3 | — | — | 11 | BALANCE | 4500 | 29 |
| 12 | 0.45 | 0.21 | 0.35 | — | 0.8 | — | 0.05 | 0.1 | — | — | 0.06 | 8 | BALANCE | 83000 | 26 |
| 13 | — | — | — | 2.1 | 0.2 | — | — | — | — | — | — | 10 | BALANCE | 0 | 30 |
| 14 | — | — | — | 2.0 | — | 0.1 | — | — | — | — | — | 8 | BALANCE | 0 | 29 |
| COMPARATIVE EXAMPLES | | | | | | | | | | | | | | | |
| 1 | — | — | — | 2.1 | 0.3 | — | — | — | — | — | — | 100 | BALANCE | 0 | 27 |
| 2 | — | — | — | 1.9 | — | 0.2 | — | — | — | — | — | 95 | BALANCE | 0 | 28 |
| 3 | 0.31 | 0.13 | — | — | — | — | — | — | — | — | — | 2 | BALANCE | 2000 | — |
| 4 | 0.35 | 0.10 | 0.27 | — | — | — | — | — | — | — | — | 2 | BALANCE | 6000 | — |
| 5 | — | — | — | 2.1 | 0.2 | — | — | — | — | — | — | 10 | BALANCE | 0 | — |
| 6 | — | — | — | 2.0 | — | 0.1 | — | — | — | — | — | 8 | BALANCE | 0 | — |

*1: NUMERALS IN THIS COLUMN REPRESENT THE NUMBER OF SCATTERED PARTICLES EACH HAVING A SIZE OF 0.1 μm TO 50 μm RESPECTIVELY (PIECES/mm²)

TABLE 2

| | ADHESIVENESS OF OXIDE LAYER (%) *2 | ADHESIVE STRENGTH OF SEALING PLASTIC (kgf/mm²) |
|---|---|---|
| EXAMPLE 1 | 0 | 2.5 |
| EXAMPLE 2 | 0 | 2.8 |
| EXAMPLE 3 | 0 | 2.7 |
| EXAMPLE 4 | 0 | 2.7 |
| EXAMPLE 5 | 0 | 2.6 |
| EXAMPLE 6 | 0 | 2.6 |
| EXAMPLE 7 | 5 | 1.4 |
| EXAMPLE 8 | 7 | 1.3 |
| EXAMPLE 9 | 0 | 2.5 |
| EXAMPLE 10 | 0 | 2.3 |
| EXAMPLE 11 | 0 | 2.3 |
| EXAMPLE 12 | 0 | 2.4 |
| EXAMPLE 13 | 1 | 1.8 |
| EXAMPLE 14 | 2 | 1.7 |

TABLE 2-continued

| | ADHESIVENESS OF OXIDE LAYER (%) *2 | ADHESIVE STRENGTH OF SEALING PLASTIC (kgf/mm²) |
|---|---|---|
| COMPARATIVE EXAMPLE 1 | 10 | 1.1 |
| COMPARATIVE EXAMPLE 2 | 12 | 0.9 |
| COMPARATIVE EXAMPLE 3 | — | 1.4 |
| COMPARATIVE EXAMPLE 4 | — | 1.5 |
| COMPARATIVE EXAMPLE 5 | — | 1.4 |
| COMPARATIVE EXAMPLE 6 | — | 1.3 |

*2: A PIECE OF ADHESIVE TAPE HAVING DIMENSIONS OF 30 mm × 30 mm IS ADHESIVELY PLACED ON AN OXIDE LAYER, AND THEREAFTER, THE ADHESIVE TAPE IS PEELED FROM THE OXIDE LAYER. NUMERALS (% IN UNIT) IN THIS COLUMN REPRESENT AN AREA OF THE OXIDE LAYER PEELED.

We claim:

1. A lead frame having an improved adhesiveness property with plastic, comprising:
   a matrix for said lead frame consisting essentially of a copper based alloy containing dispersive particles, a portion of said dispersive particles being distributed on the surface of said matrix, and a content of P in the copper based alloy being 30 ppm or less; and
   an oxide layer formed on said matrix, said oxide layer containing an oxide of said dispersive particles distributed on the surface of said matrix.

2. A lead frame as claimed in claim 1, wherein said copper based alloy constituting said matrix for said lead frame contains at least one element selected from a group consisting of Cr, Zr and Ti at a content of 0.005% by weight to 2% by weight and the balance substantially Cu.

3. A lead frame as claimed in claim 2, wherein said copper based alloy contains at least one element selected from a group consisting of Ni, Sn, Fe, Co, Zn, Be, B, Mg, Ag, Si, Mn, Cd, Al, a rare earth element, Ca and Ge at a content of 0.005% by weight to 1% by weight and/or at least one element selected from a group consisting of Nb, V, Hf, Mo, W, Y, Ta, La and Ga at a content of 0.005% by weight to 1% by weight.

4. A lead frame as claimed in claim 2, wherein said dispersive particles are a precipitated particle or a crystallized particle of at least one element selected from a group consisting of Cr, Zr and Ti and optionally including an intermetallic compound of one or more of said Cr, Zn and Ti.

5. A lead frame as claimed in claim 1, wherein said oxide layer has a thickness of 1 nm to 80 nm.

6. A lead frame as claimed in claim 1, wherein said oxide layer has a thickness of 10 nm to 50 nm.

7. A lead frame as claimed in claim 1, wherein said oxide layer is uniformly formed by surface oxidization treatment.

8. A lead frame having an improved adhesiveness property with plastic, comprising:
   a matrix for said lead frame consisting essentially of a copper based alloy containing dispersive particles with a size of 0.1 μm to 50 μm, said dispersive particles being present on the surface of said matrix within a range of 100 to 100000 pieces/mm²; and
   an oxide layer formed on said matrix, said oxide layer containing an oxide of said dispersive particles distributed on the surface of said matrix.

9. A lead frame as claimed in claim 8, wherein a content of P in said copper based alloy is not more than 30 ppm.

10. A lead frame as claimed in claim 8, wherein said copper based alloy constituting said matrix for said lead frame contains at least one element selected from a group consisting of Cr, Zr and Ti at a content of 0.005% be weight to 2% by weight and the balance substantially Cu.

11. A lead frame as claimed in claim 10, wherein said copper based alloy contains at least one element selected from a group consisting of Ni, Sn, Fe, Co, Zn, Be, B, Mg, Ag, Si, Mn, Cd, Al, a rare earth element, Ca and Ge at a content of 0.005% by weight to 1% by weight and/or at least one element selected from a group consisting of Nb, V, Hf, Mo, W, Y, Ta, La and Ga at a content of 0.005% by weight to 1% by weight.

12. A lead frame as claimed in claim 8, wherein said oxide layer has a thickness of 1 nm to 80 nm.

13. A lead frame as claimed in claim 8, wherein said oxide layer has a thickness of 10 nm to 50 nm.

14. A lead frame as claimed in claim 8, wherein said oxide layer is uniformly formed by surface oxidization treatment.

15. A semiconductor package including: a semiconductor element; a lead frame having said semiconductor element mounted thereon, said lead frame being electrically connected to said semiconductor element; and a sealing plastic for gas-tight sealing said semiconductor element and a part of said lead frame,
    said lead frame comprising:
    a matrix for said lead frame consisting essentially of a copper based alloy containing dispersive particles, a part of said dispersive particles being distributed on the surface of said matrix, a content of P in said copper based alloy being 30 ppm or less; and
    an oxide layer formed at least at a part on the matrix where said matrix contacts with said sealing plastic, said oxide layer containing an oxide of said dispersive particles distributed on the surface of said matrix.

16. A semiconductor package including: a semiconductor element; a lead frame having said semiconductor element mounted thereon, said lead frame being electrically connected to said semiconductor element; and a sealing plastic for gas-tight sealing said semiconductor element and a part of said lead frame,
    said lead frame comprising:
    a matrix for said lead frame consisting essentially of a copper based alloy containing dispersive particles with a size of 0.1 μm to 50 μm, said dispersive particles being present on the surface of said matrix within a range of 100 to 100000 pieces/mm²; and
    an oxide layer formed at a part where said matrix contacts with said sealing plastic, said oxide layer containing an oxide of said dispersive particles distributed on the surface of said matrix.

* * * * *